United States Patent [19]
Kodama

[11] Patent Number: 5,982,626
[45] Date of Patent: Nov. 9, 1999

[54] TWO DIMENSIONAL COUPLING FOR FLEXIBLE PRINTED CIRCUIT BOARDS

[75] Inventor: Masahiro Kodama, Tokyo, Japan

[73] Assignee: Asahi Kogaku Kogyo Kabushiki Kaisha, Tokyo, Japan

[21] Appl. No.: 08/868,256

[22] Filed: Jun. 3, 1997

[30] Foreign Application Priority Data

Jun. 7, 1996 [JP] Japan ..................................... 8-166686

[51] Int. Cl.⁶ ................... H05K 1/11; H01R 9/09
[52] U.S. Cl. ................. 361/749; 361/786; 361/803; 439/67; 439/77
[58] Field of Search .................................... 174/254, 261, 174/266; 361/749, 786, 789, 790, 803; 439/67, 69, 77

[56] References Cited

U.S. PATENT DOCUMENTS

| | | |
|---|---|---|
| 4,215,387 | 7/1980 | Negishi et al. |
| 5,354,205 | 10/1994 | Feigenbaum et al. ............ 439/67 |
| 5,404,239 | 4/1995 | Hirai ........................................ 439/67 |
| 5,418,691 | 5/1995 | Tokura .................................. 361/803 |

FOREIGN PATENT DOCUMENTS

| | | | |
|---|---|---|---|
| 2515917 | 5/1983 | France ..................................... 439/77 |
| 1-189988 | 7/1989 | Japan ..................................... 439/67 |
| 1-209788 | 8/1989 | Japan ..................................... 439/67 |
| 1-212488 | 8/1989 | Japan ..................................... 439/67 |
| 2-12890 | 1/1990 | Japan ..................................... 439/67 |
| 2-201993 | 8/1990 | Japan ..................................... 439/67 |
| 2-209788 | 8/1990 | Japan ..................................... 439/83 |
| 3-22490 | 1/1991 | Japan ..................................... 439/77 |
| 4-253392 | 9/1992 | Japan ..................................... 439/67 |

*Primary Examiner*—Donald Sparks
*Attorney, Agent, or Firm*—Greenblum & Bernstein, P.L.C.

[57] ABSTRACT

A flexible printed circuit board assembly comprising a first flexible printed circuit board and a second flexible printed circuit board, wherein each of the first and second flexible printed circuit boards is provided with a position fixing coupling to determine the position of the second flexible printed circuit board relative to the first flexible printed circuit board.

1 Claim, 3 Drawing Sheets

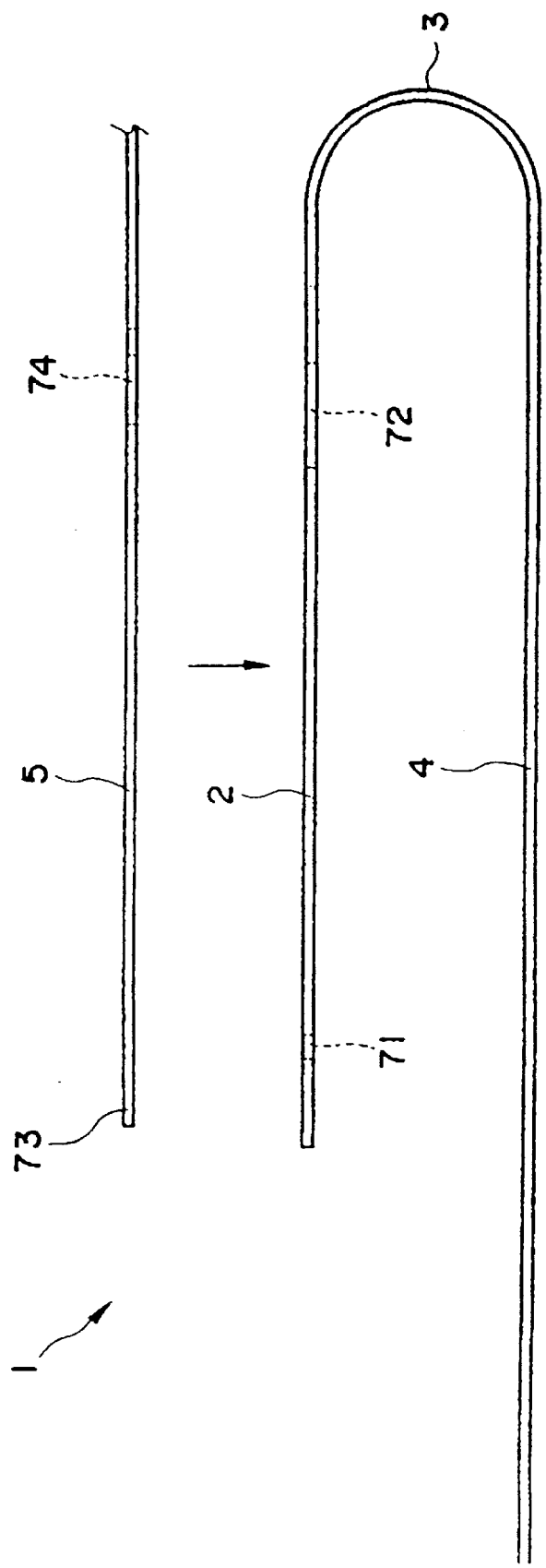

TWO DIMENSIONAL COUPLING FOR FLEXIBLE PRINTED CIRCUIT BOARDS

BACKGROUND OF THE INVENTION

1. Field of the Invention

The present invention relates to technology that facilitates the joining of flexible printed circuit boards using position fixing couplings integrally formed on the printed circuit boards.

2. Description of the Related Art

A device, such as a camera, uses a flexible printed circuit board as a circuit for controlling various electronic components in the camera. Flexible printed circuit boards joinable to other flexible printed circuit boards are known. For that purpose, there are provided a plurality of terminals on the flexible printed circuit boards.

In this case, in the joining of flexible printed circuit boards, the boards must be positioned so that the corresponding terminals line up correctly, and then the flexible printed circuit boards are connected by soldering.

However, conventional flexible printed circuit boards are not provided with couplings for positioning formed on the flexible printed circuit boards. Therefore, fixing the positions of two conventional flexible printed circuit boards when joining them is left in the hands of skilled professionals who perform the soldering. More concretely, when two flexible printed circuit boards are joined, a skilled professional must subtly adjust the position of the flexible printed circuit boards so that the terminals on respective flexible printed circuit boards come into contact with each other, and must also hold the two flexible printed circuit boards in the hands until the soldering operation is finished. This sequence of operations is labor intensive, and the precision of the positioning is not high. In particular, in cases where soldering is required in a location on the flexible printed circuit boards where it is difficult to perform soldering and positioning, the above-mentioned drawbacks are most noticeable.

In addition, due to restrictions in the workplace and the workspace, there are many cases where the circuit boards must be installed in the camera or other device after the actual soldering of the terminals to join the flexible printed circuit boards has already been performed. This also causes constraints in the assembling and installing operations.

SUMMARY OF THE INVENTION

An object of this invention is to form a flexible printed circuit board with a simple structure, and to enable sure and easy positioning of the circuit boards when joining flexible printed circuit boards.

To achieve the object mentioned above, according to the present invention, a flexible printed circuit board assembly includes a first flexible printed circuit board and a second flexible printed circuit board, wherein each of said first and second flexible printed circuit boards is provided with a position fixing coupling to determine the position of the second flexible printed circuit board relative to the first flexible printed circuit board.

The present disclosure relates to subject matter contained in the Japanese Patent Application No.8-166686 (filed on Jun. 7, 1996) which is expressly incorporated herein by reference in its entirety.

BRIEF DESCRIPTION OF THE DRAWINGS

The invention will be described below in detail with reference to the accompanying drawings, in which:

FIG. 3 shows a side view of the flexible printed circuit boards.

DESCRIPTION OF THE PREFERRED EMBODIMENTS

Flexible printed circuit boards will be explained in detail with the help of the aforementioned drawings.

Figure 1:
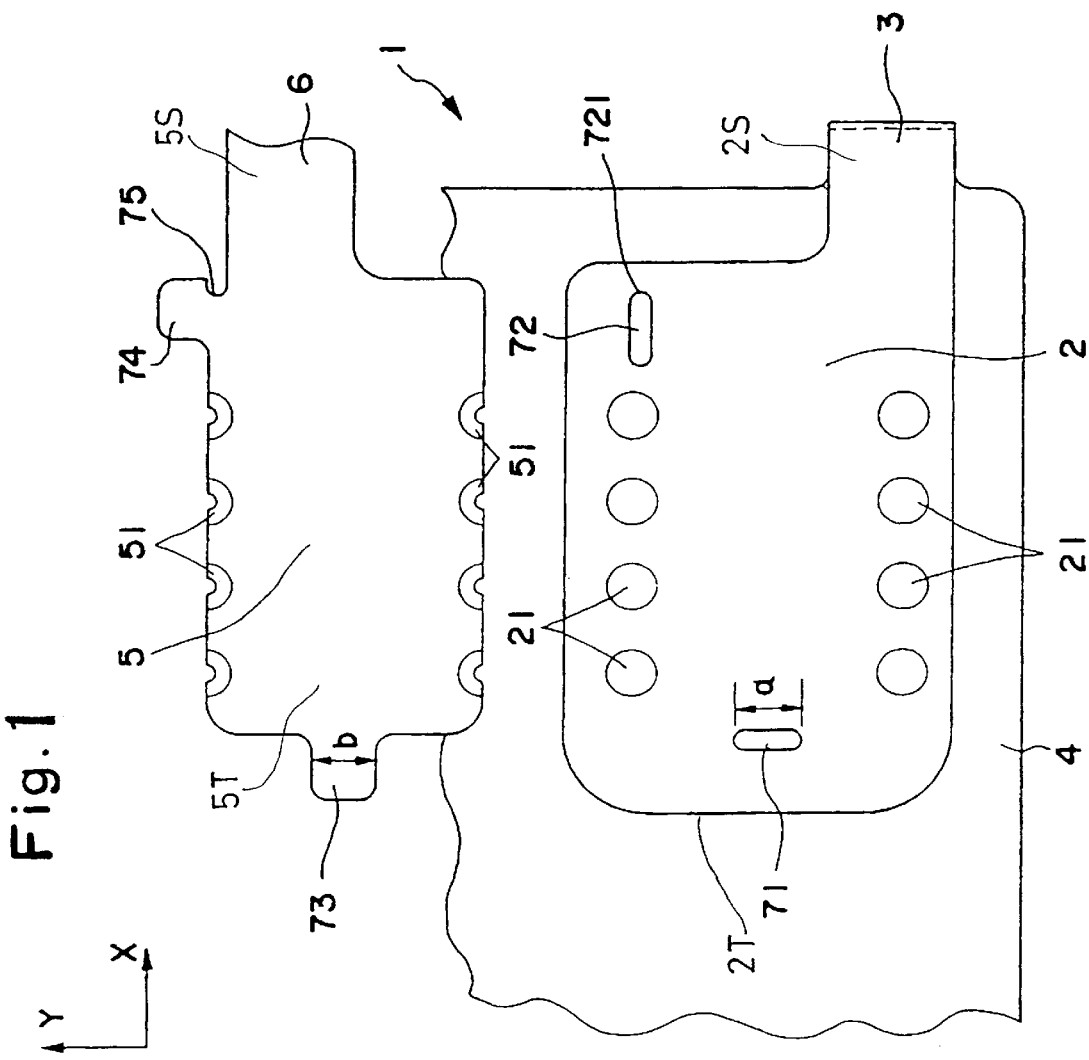
FIG. 1 is a plane drawing of the flexible printed circuit boards before they are joined.
Figure 2:
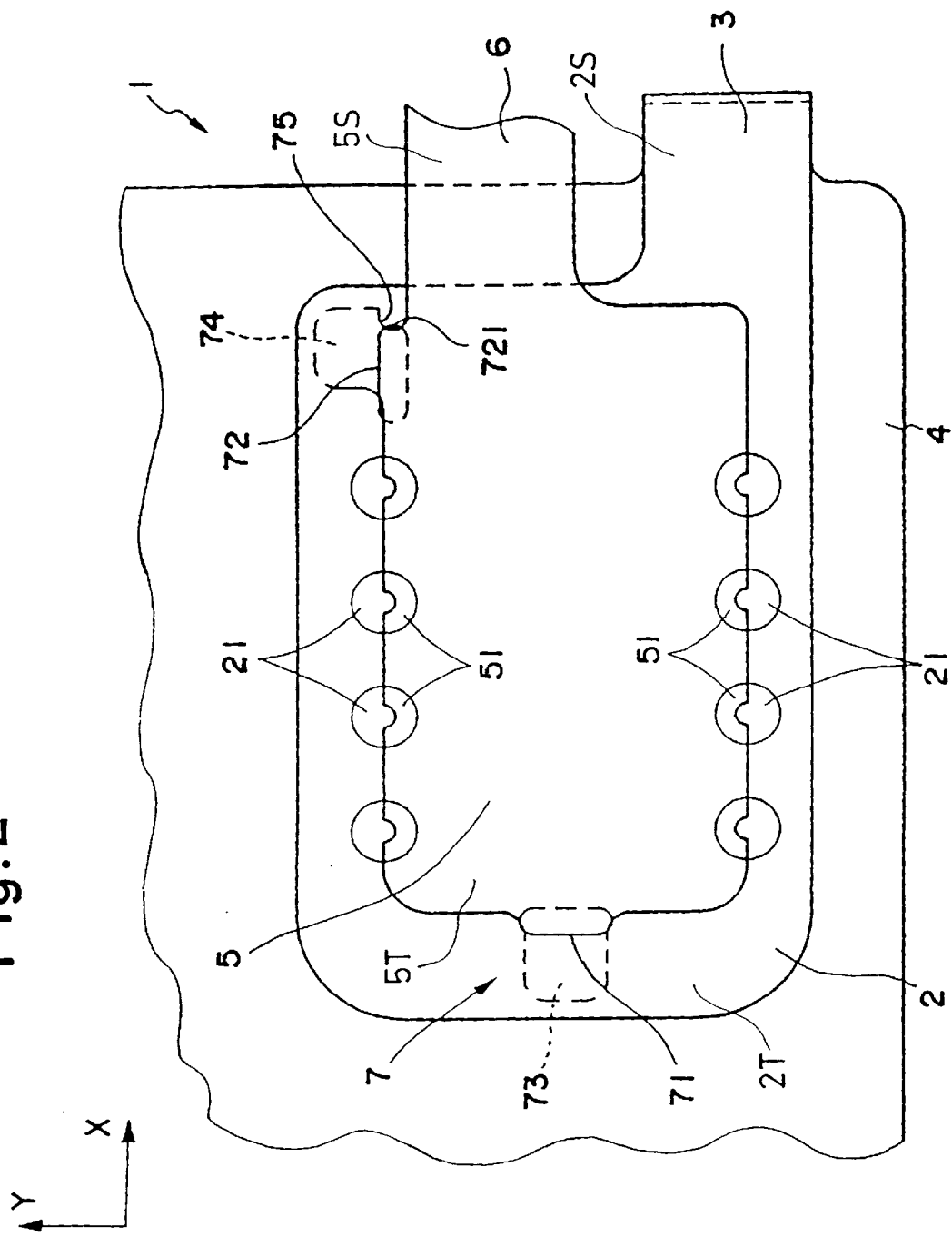
FIG. 2 is a plane drawing of the flexible printed circuit boards after they have been joined.

FIG. 1 shows the flexible printed circuit boards before being joined. FIG. 2 shows the flexible printed circuit boards after being joined. FIG. 3 shows a side view of the flexible printed circuit boards. In FIGS. 1 through 3, the right hand direction (the right hand side along the arrow X) is considered a stem portion, and the left hand direction (the left hand direction along the X axis) is considered a top edge portion. Furthermore, the directions will be explained as the X direction and the Y direction which are normal to each other.

As shown in FIG. 1, a flexible printed circuit board assembly 1 comprises a first flexible printed circuit board 2 and a second flexible printed circuit board 5, which are to be joined to each other.

A main circuit board 4 is connected to the stem portion 2S of the first flexible printed circuit board 2 via a U-shaped curved connecting portion 3. In this case, the flexible printed circuit board 2, the U-shaped connecting portion 3 and the main circuit board 4 are integrally formed.

The flexible printed circuit board 2 is made of a flexible resin material, for example, polyethylene terephthalate (polyester) or polyimide, as a base material. On the surface or in the inner portion of the base material, wiring (not shown) is formed by printing. The wiring is laid out on the connecting portion 3 and extends to the main circuit board 4.

On the first flexible printed circuit board 2, a plurality of terminals 21, which are connected to the wiring, are formed in a predetermined arrangement. Each terminal 21 is circular.

When joining the flexible printed circuit board 2 and the flexible printed circuit board 5, the terminals 21 of the first flexible printed circuit board 2 overlap corresponding terminals 51 (see FIG. 2). In this embodiment, the terminals 21 are positioned along the longitudinal direction (X direction) of the first flexible printed circuit board 2, at predetermined intervals, in two rows.

The flexible printed circuit board 5 is made from the same flexible sheet base material. On the surface of the base materials or in the inner portion of the materials, wiring is formed by printing. The wiring is laid out on the connecting portion 6 and extends to the stem portion 5S of the second flexible printed circuit board 5.

On opposing longitudinal sides of the flexible printed circuit board 5, the terminals 51, which are connected to the wiring, are arranged at predetermined intervals. Each terminal 51 is half-circular. The outer diameter of each terminal 51 is substantially identical to the outer diameter of the corresponding terminals 21.

As with the aforementioned flexible printed circuit board assembly 1, a position fixing coupling 7 is provided to fix the positions of flexible printed circuit board 2 and flexible printed circuit board 5 with respect to one another. The position fixing coupling 7 is integrally formed with the first and second flexible printed circuit boards 2 and 5, respectively. While referring to FIGS. 1 and 2, the position fixing coupling 7 will be explained.

At the substantially center portion along the Y direction (width direction) of the top edge portion 2T (minor side) of the first flexible printed circuit board 2, an elongated hole 71 passes through the first flexible printed circuit board 2. On the other hand, at the stem portion of the first flexible printed circuit board 2, an elongated hole 72 extends along a longitudinal side (major side) of the first flexible printed circuit board 2. The elongated hole 72 is arranged to pass through the first flexible printed circuit board 2.

A projection 73 is provided at the substantially center portion along the Y direction (width direction) of the top edge portion T5 (minor side) of the second flexible printed circuit board 5, substantially coplanar with the second flexible printed circuit board 5. On the other hand, at the stem portion of the second flexible printed circuit board 5, a projection 74 extends from a position along a longitudinal side (major side) of the second flexible printed circuit board 5, substantially coplanar with the second flexible printed circuit board 5. The projection 74 is formed to protrude in the Y direction. The projection 73 is inserted into the elongated hole 71, and the projection 74 is inserted into the elongated hole 72. It is preferable that the projections 73 and 74 are integrally formed with the second flexible printed circuit board 5.

The length "a" of the elongated hole 71 is equal to or slightly larger than the width "b" of the projection 73 to facilitate the insertion of the projection 73 into the elongated hole 71, and to provide extra space to adjust the position of the second flexible printed circuit board 5 relative to the first flexible printed circuit board 2.

It should be understood that the elongated holes 71 and 72 are arranged so that the longitudinal sides of the elongated holes 71 and 72 are normal to each other. Likewise, the projections 73 and 74 are arranged so that the directions of projection of the projections 73 and 74 are normal to each other.

As discussed above, the elongated holes 71 and 72 and the projections 73 and 74 constitute the position fixing coupling 7.

At a base portion of the projection 74, there is provided a U-shaped groove 75. The function of groove 75 is to prevent the projection 74 from disengaging from the elongated hole 72 when the groove 75 engages with an inner edge portion 721 of the elongated hole 72. The groove 75 constitutes a disengagement prevention portion.

Next, a method for joining the flexible printed circuit board assembly 1 will be explained.

As shown in FIG. 1, the flexible printed circuit board 2 and the flexible printed circuit board 5 are prepared. The first flexible printed circuit board 2 and the second flexible printed circuit board 5 are then joined by inserting the projection 74 into the elongated hole 72, subsequently, the flexible printed circuit board 5 is moved toward the stem portion 5S relative to the first flexible printed circuit board 2 to engage the groove 75 of the projection 74 with the inner edge portion 721 of the elongated hole 72.

The second flexible printed circuit board 5 is then curved (bowed or arched) as desired, and the projection 73 is inserted into the elongated hole 71. According to this assembling operation, the positioning of the second flexible printed circuit board 5 in the X and Y directions with respect to the first flexible printed circuit board 2 is finished (the state of FIG. 2). Once the positioning is completed, the flexible printed circuit boards 2 and 5 are arranged so that the center of each terminal 51 is aligned properly with the center of each corresponding terminal 21. That is, center lines of the terminals 21 of the first flexible printed circuit board 2 align or coincide with center lines of the terminals 51 on the second flexible printed circuit board 5.

Once the positioning is completed, since the groove 75 is secured in the inner edge portion 721 of the elongated hole 72, the projection 74 is prevented from disengaging from the elongated hole 72. Accordingly, the second flexible printed circuit board 5 does not move in the direction of the stem portion 5S with respect to the first flexible printed circuit board 2. As a result, the projection 74 does not disengage from the elongated hole 72. Consequently, the flexible printed circuit board 5 does not shift in either the X or Y direction with respect to flexible printed circuit board 2, and the proper positioning is maintained.

As stated above, with the first and second flexible printed circuit boards 2 and 5 being in a joined state, each terminal 51 is electrically connected to the exposed portion of each corresponding terminal 21 by soldering.

For the flexible printed circuit board assembly 1, the position fixing coupling 7, which comprises the elongated holes 71 and 72 and the projections 73 and 74, is integrally formed on the first and second flexible printed circuit boards 2 and 5. This arrangement can eliminate the necessity to employ a separate positioning device (e.g., a positioning boss portion) in a camera or other such devices. Accordingly, there is an advantage that the positioning operation of the flexible printed circuit boards with a simple structure, as well as the method and operations of the position fixing coupling, can be performed no matter where the flexible printed circuit boards are installed.

The soldering of terminals 51 to terminals 21 when joining the first flexible printed circuit board 2 with the second flexible printed circuit board 5 can be performed before the boards are installed in a camera or other such device, or after one of the boards 25 has been installed in the device.

As stated above, the explanations regarding the flexible circuit boards are explained based on the embodiment shown in the drawings, but the invention is not limited to these examples. Each structural element or the position fixing means can be replaced by other compositions with the same function.

For example, the locations, number, and shape of the projections 73 and 74, the elongated holes 71 and 72, the groove 75, and the terminals 21 and 51 are not limited to those depicted in the drawings. Any alternative can be employed if the alternative can have the same function as the above listed projections 73 and 74, the elongated holes 71 and 72, the groove 75, and the terminals 21 and 51.

As mentioned above, according to the flexible printed circuit board of the present invention, the positioning operation of the flexible printed circuit boards can easily and properly be done. Also, once the position is fixed, the fixed state is stably maintained.

Also, the joining of the flexible printed circuit boards can be performed after both of the flexible printed circuit boards are installed in a device, such as a camera, or after one of the first and second flexible printed circuit board is installed in the device. This expands the freedom of assembly and of the installation process. As a result, positional fixing that is normally difficult to perform is made simple, increasing work efficiency.

What is claimed is:

1. A position fixing coupling for electrically connecting a first printed circuit board and a second printed circuit board, comprising:

a first flexible printed circuit portion of the first printed circuit board, the first flexible printed circuit portion being formed in a rectangular shape having major sides and minor sides and a predetermined number of terminals;

a first elongated hole integrally formed along a minor side of the first flexible printed circuit portion and extending in a first longitudinal direction;

a second elongated hole integrally formed along a major side of the first flexible printed circuit portion and extending in a second longitudinal direction perpendicular to the first longitudinal direction;

a second flexible printed circuit portion of the second printed circuit board, the second flexible printed circuit portion being formed in a rectangular shape having major sides and minor sides and a predetermined number of terminals to be connected to those of the first flexible printed circuit portion;

a first projection integrally formed along a minor side of the second flexible printed circuit portion and projecting in a first projecting direction, a width of the first projection being equal to or slightly less than a length of the first elongated hole;

a second projection integrally formed along a major side of the second flexible printed circuit portion and projecting in a second projecting direction perpendicular to the first projecting direction; and a disengaging preventing mechanism including, at a stem portion of the second projection, a groove formed in a direction of the major side of the second flexible circuit board that prevents the second projection from disengaging from the second elongated hole when the groove is fitted in the second elongated hole, the first and second projections extending in a plane including a surface of the second flexible printed circuit portion on which the predetermined number of terminals are provided, and the first and second projections engaging the first and second elongated holes of the first flexible printed circuit portion for determining the position of the second flexible printed circuit portion relative to the first flexible printed circuit portion in both of the first and second longitudinal directions, and center lines of the predetermined number of terminals on the first flexible printed circuit portion coinciding with center lines of the predetermined number of terminals on the second flexible printed circuit portion when the first and second projections and the groove engage the first and second elongated holes.

\* \* \* \* \*